(12) United States Patent
Austin

(10) Patent No.: US 7,857,660 B2
(45) Date of Patent: Dec. 28, 2010

(54) WATT HOUR METER SOCKET ADAPTER WITH CURRENT TRANSFORMER HOUSING STRUCTURE

(76) Inventor: Randy Austin, 239 Quiet Waters Rd., Belmont, NC (US) 28012

( * ) Notice: Subject to any disclaimer, the term of this patent is extended or adjusted under 35 U.S.C. 154(b) by 278 days.

(21) Appl. No.: 12/267,603

(22) Filed: Nov. 9, 2008

(65) Prior Publication Data
US 2009/0124119 A1 May 14, 2009

Related U.S. Application Data

(60) Provisional application No. 60/987,032, filed on Nov. 9, 2007.

(51) Int. Cl.
*H01R 33/945* (2006.01)
(52) U.S. Cl. ..................... 439/517
(58) Field of Classification Search ............... 439/517, 439/508, 146; 361/668, 660, 670
See application file for complete search history.

(56) References Cited

U.S. PATENT DOCUMENTS

| | | | | |
|---|---|---|---|---|
| 5,385,486 A * | 1/1995 | Robinson et al. | ............ | 439/517 |
| 5,620,337 A * | 4/1997 | Pruehs | ............ | 439/508 |
| 6,475,028 B1 | 11/2002 | Robinson et al. | | |
| 6,663,405 B1 | 12/2003 | Robinson et al. | | |
| 6,663,422 B1 | 12/2003 | Robinson et al. | | |
| 7,153,157 B2 * | 12/2006 | Robinson et al. | ............ | 439/508 |
| 7,232,335 B2 | 6/2007 | Preuhs et al. | | |
| 7,614,908 B2 * | 11/2009 | Zhang | ............ | 439/517 |
| 7,621,775 B1 * | 11/2009 | Michaud et al. | ............ | 439/517 |

OTHER PUBLICATIONS

Marwell Corporation Product Specification Sheet; Marwell Part No. SP-K7-2-9s-BP; Feb. 2006.
Marwell News; "Convert Your Landis & Gyr K7 to a 9s CT Rated Meter" Feb. 2006.
Marwell News; "Safety Disconnect for the K-7" May 2001.
Marwell News; "320 Amp,K-7 to Socket Conversion" Jan. 2002.
Marwell News; "Convert Landis & Gyr K7 to 2S Meter" May 2003.

* cited by examiner

*Primary Examiner*—Xuong M Chung Trans
(74) *Attorney, Agent, or Firm*—Summa, Additon & Ashe, P.A.

(57) ABSTRACT

A meter socket adapter includes an insulating housing that is connected to a power circuit on one side by bus bars and connected to a watt-hour meter on the other side by jaw contacts. The housing includes insulating compartments for current transformers through which the bus bars extend. Current transformers extend around the bus bars and are housed in individual compartments in the current transformer housing. Transformed current is directed to the jaw contacts for metering with the watt-hour meter. The bus bars include an insulating layer there on, reducing the need for insulation around the secondary of the current transformers. The current transformers are then significantly smaller and fit within a K-Base meter socket. The adapter housings define a cavity with separate dielectric plates between the bus bars and the jaw contacts. The adapter conveniently allows for self-contained meters to be used in high current installations.

50 Claims, 4 Drawing Sheets

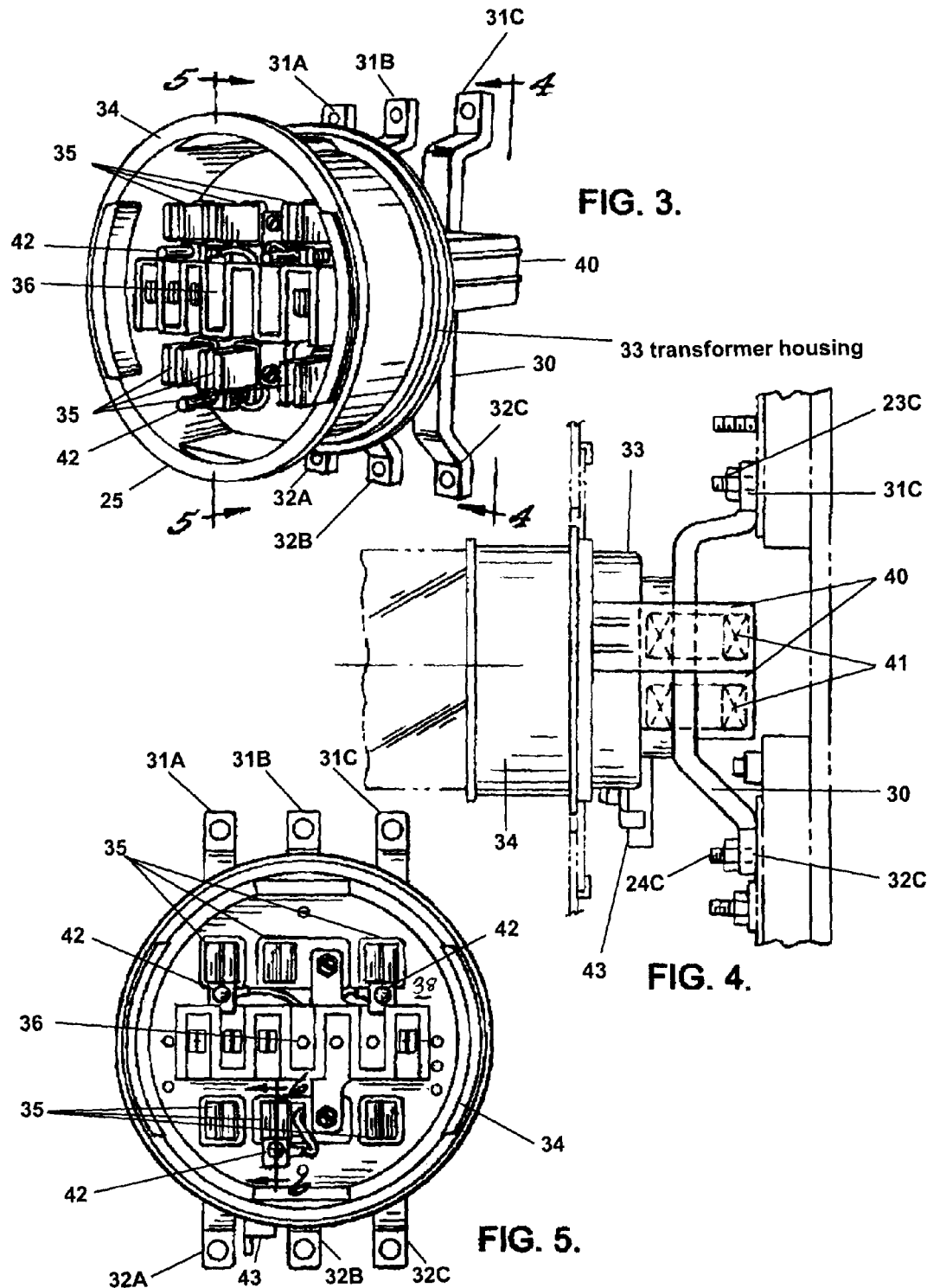

WATT HOUR METER SOCKET ADAPTER WITH CURRENT TRANSFORMER HOUSING STRUCTURE

CROSS-REFERENCE TO RELATED APPLICATIONS

This application is a non-provisional patent application claiming priority to U.S. Provisional Patent Application Ser. No. 60/987,032 filed on Nov. 9, 2007, the content of which is incorporated by reference as if fully set forth herein.

FIELD OF THE INVENTION

The invention relates to a socket adapter for installing a watt-hour power meter within a circuit providing electricity to a consumer. The invention is particularly useful for installation within a high current circuit and eliminates the need for external current transformers.

BACKGROUND OF THE INVENTION

Watt-hour power meters have been known in the art of electric power conduction for many years. In a typical embodiment, a building such a commercial establishment has incoming current from a utility power network. This current passes through a meter socket adapted to attach a watt-hour meter to the circuit for measuring and billing power consumption. The power line from the utility power grid is connected to the line end of the meter socket, and the building receives the appropriate amount of power through the load end of the meter socket.

Numerous pieces of equipment have been used to conveniently and safely attach the watt-hour meter to the circuit being measured. The circuit may incorporate sockets that are rated according to the maximum current that is allowed to flow through the socket, which depends upon the electricity needs of the building at hand. Accordingly, numerous watt-hour meters are available to fit the various meter sockets that are appropriate for different operating conditions. In fact, Landis and Gyr, one manufacturer of meters and meter socket equipment, makes its Meter Socket Application Guide available on the Internet for convenient use (www.lanisandgyr.com). This guide notes that certain installations use either self-contained meter sockets or transformer rated sockets, depending upon the service type at hand.

A self-contained meter socket allows the user to connect the meter directly to the meter socket—in the absence of additional, external current transformers proximate the socket. In most situations, current transformers are housed in the meter itself for self-contained installations. In a different scenario, a current transformer rated meter socket, also known as a CT-rated socket, pulls current from the utility company's power network grid through a series of specially calibrated current transformers. The current transformers, often housed in a cabinet directly adjacent the meter socket, bring the current level from the utility power grid down to an appropriate level for the building to use. A proper kind of meter attaches to the meter socket after the current has been transformed to an appropriate level. For example, a 600 amp current may be transformed to 5 amps in a current transformer enclosure before entering the CT-rated socket to meet governmental codes and industry specifications.

As noted in the Landis and Gyr Meter Socket Application Guide, electrical service may be, for example, single phase, 3-phase/3-wire, and 3-phase/4-wire in either a wye or delta wiring arrangement. Each of these set-ups require a planned approach to the form of meter (e.g., 2 S, 3 S, 5 S, 14K, and the like) and the socket type that describes the number of jaw contacts and the current rating (e.g., K-7 480 A continuous/600 A Maximum current rating). These designations are well-known in the art of power metering.

One type of self-contained metering installation that has become prevalent in recent years is K-Base metering. See prior art FIG. 2 herein. K-Base metering utilizes a meter socket that is equipped to handle continuous electric loads greater than 320 amperes using self-contained meters attached directly to the meter socket (e.g., bolted thereon). K-Base metering has proven useful in class 400 ampere continuous duty as well as for applications seeing intermittent loads up to 600 amps.

The rugged construction and the thick current connectors allow K-Base meter socket connections to significant current loads. The watt-hour meter used on a K-Base meter socket is bolted onto the respective line and load socket connectors. When a facility uses high currents (i.e., above 320 amperes) consistently, it is also permissible for current transformer boxes to be added to an installation to bring currents down to more useful levels before transmitting current to a K-Base meter. It simply depends upon the needs of the installation. Of course, adding current transformer boxes adds to the cost and space requirements of the installation.

In any power metering installation, bolting and un-bolting the meter presents a significant danger to the person working on the site. In certain embodiments, the meter socket carries dangerous current levels that are transformed within the meter itself. When a consumer or utility worker removes the meter, the full current load on the socket is exposed. Accordingly, personnel who work on or near that meter socket face grave consequences if they touch a live socket by accident.

Numerous devices have been used to make watt-hour meter installations safer and more convenient, especially for high currents up to 600 amperes. Prior efforts to address high current level power meter installations include transforming the current with known coil-type current transformers that significantly lower the current level actually measured by the meter. The transformed current, of course, can be measured and then proportionally converted by metering software to accurately determine the power consumption on the original line. Unfortunately, efforts to utilize this technology have required rewiring an existing circuit to install the transformers and then run the transformed current leads to a separate location for metering. This is quite a bit of work and still requires a technician to deal directly with the high current lines. See U.S. Pat. No. 7,232,335 (Preuhs 2007).

The Preuhs '335 patent also discloses a watt-hour meter adapter with current transformers about its bus bars that run through the adapter housing. Current leads from the current transformers are directed to jaw contacts on the housing which ultimately engage a watt-hour meter. The problem with the Preuhs design, as shown in FIG. 17 therein, is that the current transformers are installed in the same housing that connects the meter jaw contacts. In this embodiment, the high current bus bars are directly adjacent the upper face of the jaw contact housing and are in close proximity to the areas manually handled by power technicians. The Preuhs embodiment, therefore, is not safe for currents on the bus bars up to 600 amperes. In fact Preuhs limits its use to CT-rated meters (col. 9, lines 10-47).

Other adapters have been developed for various K-Base metering applications, but these have required large current transformers that do not easily fit within the meter socket without inconveniently shaped housings for the adapter. Other adapters simply do not include transformers within the adapter itself and rely on outside current transformer enclosures to bring the currents down to measurable levels.

A need continues to exist in the art of watt-hour metering for a meter socket adapter that fits properly into a meter socket, allows for a wider variety of watt hour meters to be installed in the socket, allows fast and safe installation and removal of the watt-hour meter by technicians, and properly insulates the exposed face of the adapter from high currents on the meter socket.

BRIEF SUMMARY OF THE INVENTION

In one embodiment, the invention is a meter socket adapter that replaces a 600 Amp K-Base meter with a form 8 S/9 S electronic meter without degrading the metering installation. The adapter is completely self contained and includes current transformers with current ratios of 400:5 in preferred embodiments. The adapter includes by-pass switches that short the current transformers when the meter is not in the circuit. Although a preferred embodiment converts a 600 Amp socket, the adapter conveniently fits within numerous circuits of varying current load. The safety features in the adapter make it particularly useful in, but not limited to, high current circuits carrying more than 320 amps.

The adapter has bus bars that include an insulating layer so that the current transformers in the adapter require little or no insulation. The secondary of the current transformers may be in direct contact with the insulated bus bars. The reduced insulation on the current transformer makes them smaller and allows for a current transformer housing to be designed for a better fit within a K-base metering application. In preferred embodiments, the current transformer housing is divided into individual transformer compartments for housing a single current transformer and allowing an insulated bus bar to pass there through.

The base of this adapter includes a separate housing for the current transformers and the jaw contacts on the face of the adapter. The current transformer housing and the jaw contact housing are removed from one another to keep the high currents on the bus bars safely removed from an associated meter that personnel may touch and work on in a power servicing environment. The current transformer housing and the jaw contact housing can be removed from one another for safe repair to either portion.

The adapter is capable of transforming 600 amps of current on the bus bars without another current transformer box on the customer's site. The result is a more efficient, safer, and less costly metering installation.

BRIEF DESCRIPTION OF THE DRAWINGS

FIG. 3 is a side view of the adapter according to this invention.

FIG. 4 is a side schematic view of the adapter according to this invention installed on a K-Base meter socket.

FIG. 5 is a top view of the jaw contacts of the adapter according to this invention.

DETAILED DESCRIPTION

Figures 1, 2:
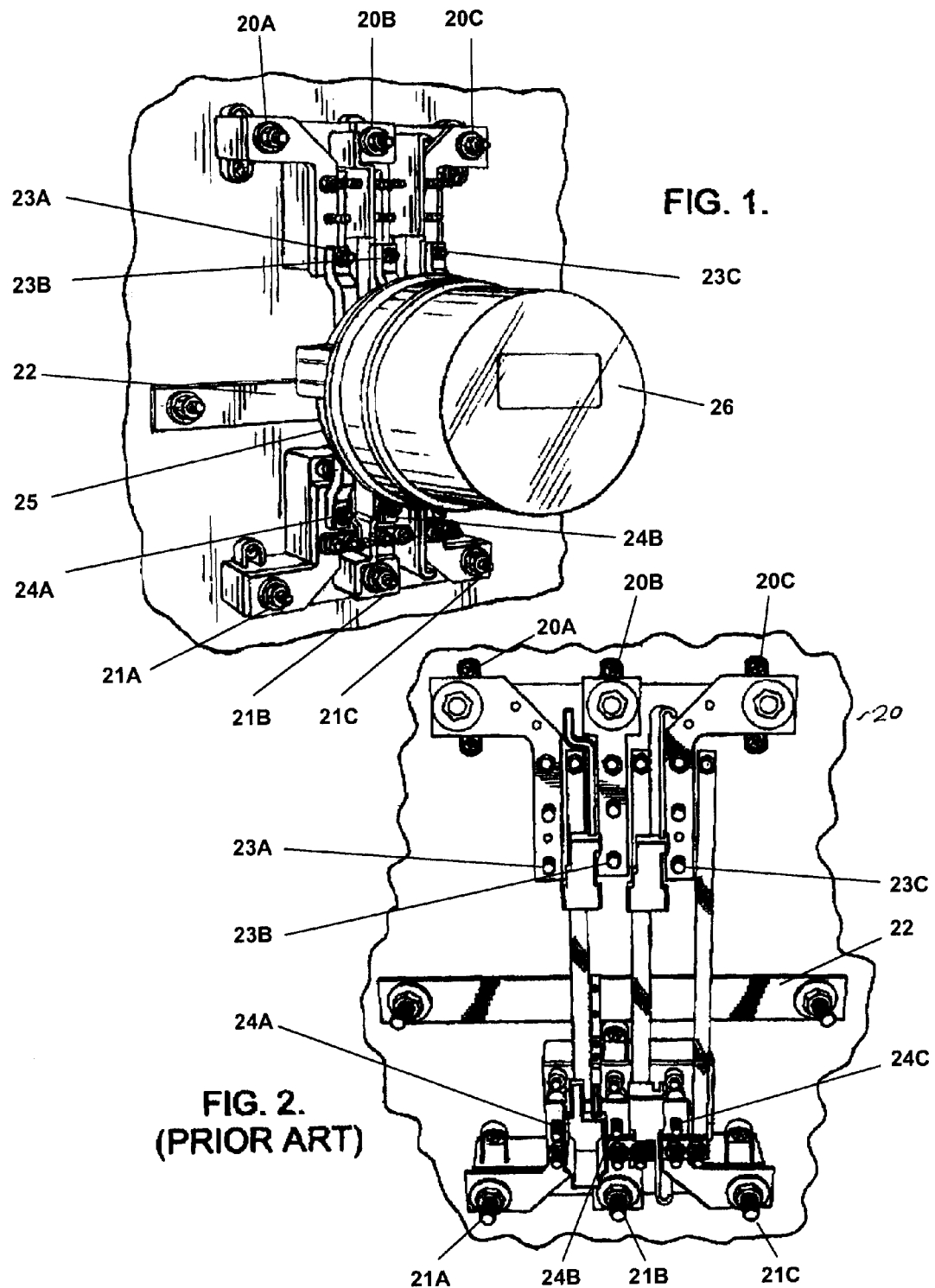
FIG. 1 is a perspective view of the adapter according to this invention installed in a K-Base metering socket.
FIG. 2 is a perspective view of a prior art K-Base meter socket that can be used with the adapter of this invention.

The meter socket adapter 25 disclosed herein includes safety features previously unknown in the art. These features include, but are not limited to, separable housings for current transformers 41 and jaw contacts 35 allowing for portions of the adapter 25 to be accessed without removing the entire adapter from the circuit. The current transformer housing includes individual insulating compartments 40 for the transformers 41. The transformers 41 need less insulation around the secondary of the transformer 41 because the adapter of this invention includes insulation around the bus bars 30. The secondary of the transformer can be exposed because the transformer 41 is included within an insulating compartment 40 through which the bus bar 30 extends. The smaller transformer body allows for a more precisely measured current transformer housing 33 with dimensions that fit better and more securely within a meter socket 20. In this way, the high currents on the bus bars 30 and the meter socket 20 can be covered with insulating material and are less likely to be accidentally touched by a utility worker on the site.

In one embodiment, the invention herein is a meter socket adapter 25 for converting a 3-phase self-contained K-base meter socket 20 to a transformer-rated meter socket carrying a maximum of 10 amps to an attached watt-hour meter 26. The adapter 25 includes three bus bars 30 that connect directly to the meter socket 20 and become an integral part of the circuit for which power consumption will be measured. The bus bars 30, made of a conductive metal such as copper, each carry a respective phase of the current, which may be of a level that is quite dangerous to manage by technicians and other power professionals that must work on these circuits.

The bus bars 30 are each in electromagnetic communication with a respective current transformer 41, or coil, designed to transform the high amplitude current on the line 31 and load 32 connections to a much smaller current that connects to the watt hour meter 26 for measurement. The current transformers 41 are positioned around the bus bars 30 in a permanent, non-removable configuration so that the adapter 25, its bus bars 30 and the respective current transformers 41 become an integral part of the meter socket. This allows for connecting and disconnecting a watt-hour meter 26 to a meter socket 20 within an electrical circuit while maintaining uninterrupted current flow on the circuit.

The transformed current on the secondary side of the current transformers 41 is directly proportional to the current flowing in the bus bars 31. For current on the bus bars at 600 amps, the current transformers are designed with a current ratio of 400:5 or 80:1. In this case, the 600 amps on the bus bars 31 is transformed to 7.5 amps on the current leads 46. The adapter 25 of this invention is useful for a wide range of current loads above 300 amps and allows for metering a transformed current on the order of 0.10 to 10 amps (10 amps max), preferably 7.5 amps or less. Of course, the transformed current leads 46 are connected to jaw contacts 35. The jaw contacts 35 are appropriately grounded as necessary in traditional circuits. The jaw contacts 35 are designed to receive current connectors (stabs) 53 from a watt-hour power meter 26. The watt-hour meter, of course, is capable of determining power consumption on the high current application line by utilizing the proportional transformed current signal from the coils 41.

In the adapter 25 of this invention, the watt-hour meter 26 can be removed with little or no danger to the technician because the current line to the meter 26 is no greater than 10 amps. In fact, when the watt-hour meter 26 is removed from the adapter 25, normally connected plungers 42 push shorting lines 50 into contact with the transformed current leads 46 so that the jaw contacts 35 on the adapter 25 are safe for handling.

The adapter 25 described herein allows for a single unit to become a permanent part of the meter socket 20 so that the technician never needs to touch the high current line 31 or load 32 bus bars. By including the current transformers 41 on the bus bars 30 when making the adapter 25, the single unit adapter does not require rewiring the circuit to install a meter. The adapter 25 can be placed directly into the circuit to be measured and remain there even when the watt-hour meter 25 is removed. In fact, the high current line does not necessarily have to be turned on and off to install, adjust, or remove the watt-hour meter 26. The adapter 25, therefore, represents a great improvement in the art.

The invention is best described by reference to the attached Figures. FIG. 1 shows the adapter 25 installed in a K-Base meter socket 20 of the prior art. The bus bars 30 have openings that connect to bolts on the socket. FIG. 2 discloses more details about a typical K-Base meter socket 20. In a standard configuration, the K-Base socket 20 includes line-in socket terminals 20A-20C for receiving incoming current from a utility company's power grid. The incoming current is usually passed across connectors (e.g., bus bars 30) associated with a metering apparatus to the load-out terminals 21A-21C of the meter socket. The K-Base socket also includes ground strap 22.

Many kinds of meters connect to K-Base meter sockets via bus bars, such as those disclosed herein. The line-in bus bars connect to respective bolts 23A-23C on the K-Base socket 20, and the load out bus bars connect to bolts 24A-24C on the K-Base socket. There is a limitation, however, in the amount of current metered across the bus bars in prior art applications. For service applications requiring more than 320 amperes, such as a 400 A circuit, the current is usually transformed to lower levels before being conducted to the meter socket. The transformed current up to 7.5 amperes is then available for metering with a wide array of CT-rated watt-hour meters. This kind of installation presents a problem for current loads greater than 7.5 amperes because the current transformer boxes necessary to bring down the current level are expensive and cumbersome. Of course, even at 7.5 amperes on the meter socket, the sockets are quite dangerous for technicians working on the socket.

The invention herein addresses these concerns about prior art metering. First, the adapter 25 fits directly and permanently into a K-Base meter socket 20. No re-wiring or other exposure to the meter socket 20 is required to install the adapter 25 or to attach and detach watt-hour meters 26 to the adapter 25. The adapter also incorporates its own current transformers 41 in the overall adapter housing, specifically in a current transformer housing 33.

The adapter of this invention has been tested with various current transformers in place. Test results, of course, are included herein for example only and in no way limit the invention. In one embodiment, the current transformers 41 have 60 turns made of 18 AWG insulated copper wire, carry a maximum primary current of 450 A, have an operating frequency of 50 Hz, and accuracy of 0.1 percent or better. The drift due to temperature change is +/− 2.0 percent. In a different embodiment, the current transformers 41 have 120 turns made of 18 AWG insulated copper wire, carry a maximum primary current of 600 A, have an operating frequency of 50 Hz, and include a transformer core sized to drive 5 A at 600 A primary current with accuracy of 0.1 percent or better. The drift due to temperature change in this embodiment is again +/− 2.0 percent.

The design of the adapter 25 disclosed herein eliminates the need for a current transformer box at the site of the meter socket 20. For purposes herein, eliminating the extra current transformer box is also described as an absence of additional local current transformer installations on the circuit. In other words, it is common for a utility company to transform current at various points on a power grid over large geographic regions. One goal herein, however, is to distinguish between current transformation at the utility company level, such as transformers in a sub-station, and local current transformers at the consumer's site, such as a CT box on the building using the power. The adapter 25 of this invention includes integral current transformers 41 and eliminates the local current transformation that is necessary for current levels above 320A in meter sockets of the prior art. In a sense, without limiting the invention, the term "local" indicates a current transformer box on or at least proximate to the power consumer's property. Essentially, this invention does not require a current transformer box (CT Box) in addition to the meter socket box.

FIGS. 3-5 and 8 show more unique details about the meter socket adapter 25 disclosed herein. The adapter 25 attaches to the meter socket 20 via bus bars 30. In the case of three-phase power, each bus bar 30 carries one phase of the current from the line in socket terminals 20A to 20C to the line out socket terminals 21A to 21C on the K-Base meter socket 20 shown in FIG. 2. The bus bars 30 of this invention are characterized, in part, by being covered with a plating layer (e.g., tin lead).

In yet another innovation to the art, the bus bars 31 of the adapter 25 may be covered in shrink-wrap tubing, or some other insulating layer like a tape, to create a dielectric barrier between the secondary of the current transformers 41 and the bus bars 31. In this way, the adapter 25 is tailored to use current transformers with less insulation around the transformer coil itself. The transformers 41 can then be smaller and fit more precisely in K-Base meter sockets. By minimizing the size of the current transformers 41, the adapter 25 uses a current transformer housing 33 that completely encompasses the current transformers yet still fits within open spaces in a K-Base socket. By fitting down into the K-Base socket 20, the adapter 25 has a shorter profile and removes the higher currents from the face 38 of the adapter 25 and associated jaw contacts 35, 36.

In one preferred embodiment, the current transformer housing 33 is divided into individual transformer compartments 40 that house current transformers 41 that do not include any extra insulation around the secondary of the transformer 41. In this embodiment, the secondary coil hangs on a respective bus bar 31 and is in contact with the shrink wrap insulation around the bus bar. The individual transformer compartment 40 may include a removable cap over the bottom of the transformer secondary for any necessary repairs or re-fits.

The adapter is particularly useful in its ability to connect and disconnect a watt-hour meter 26 to a meter socket 20 within an electrical circuit while maintaining uninterrupted current flow on the circuit. This is possible, in part, because each bus bar 30 on the adapter 25 includes a respective current transformer 41 in electromagnetic communication with the bus bar 30. In a preferred embodiment, the insulating layer on the bus bar allows for less insulation around the secondary of the current transformers 41. This feature is preferred to reduce the size requirements for the transformers 41 as space in the K-Base meter socket 20 is limited. Insulating the bus bars 30 allows more flexibility in the type of current transformers 41 used in the adapter 25. In one embodiment, the adapter 25 houses coils in which the secondary of each transformer 41 is entirely exposed but surrounded by a dielectric compartment 40 for housing each transformer. The shape of the individualized compartment 40 within the current transformer housing 33 can then be manufactured to easily fit within a K-Base meter socket 20. In a preferred embodiment, the individual transformer compartments 40 in the current transformer housing 33 are substantially rectangular and of a dimension that fits with the space available in a K-Base metering socket. Large, highly insulated, and substantially round current transformers that are disposed about the bus bar 30 make for a difficult fit in the K-base meter applications. The current transformer housing 33 on the adapter 25 and the integral transformer compartments 40 holding each transformer 41 about a bus bar 30 are of the necessary dimensions to fit adjacent the grounding strap 22 of the K-Base meter. Being substantially rectangular in preferred embodiments helps in placing the dielectric transformer compartments 40 within the K-Bas meter.

Figure 7:
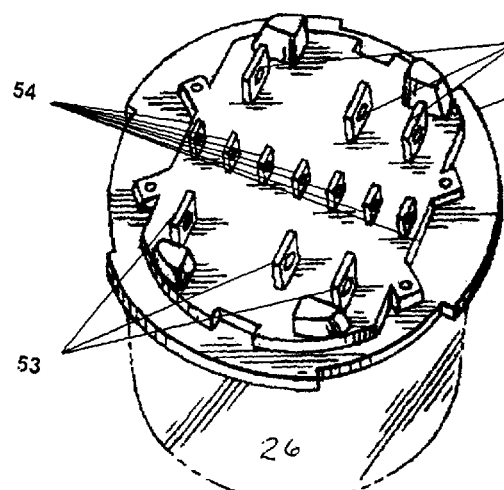
FIG. 7 is a side view of a prior art meter for attaching to the adapter of this invention.
Figure 8:
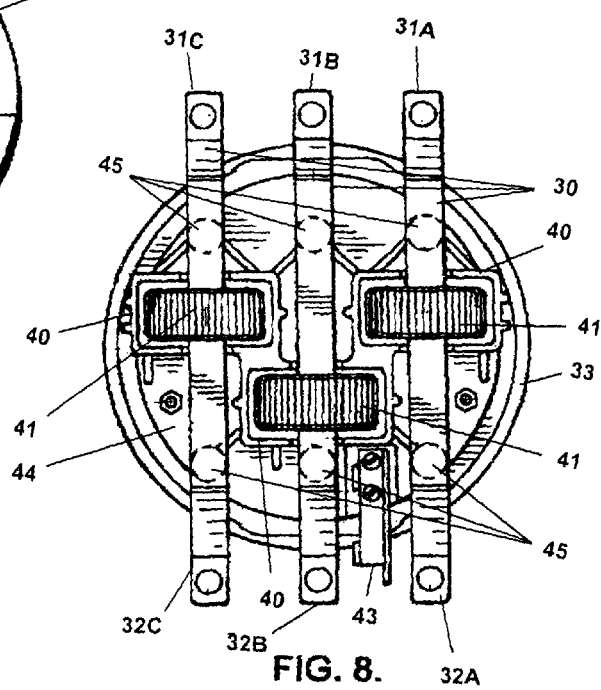
FIG. 8 is a bottom view of the adapter according to this invention and shows individualized current transformer compartments within the current transformer housing.
Figure 9:
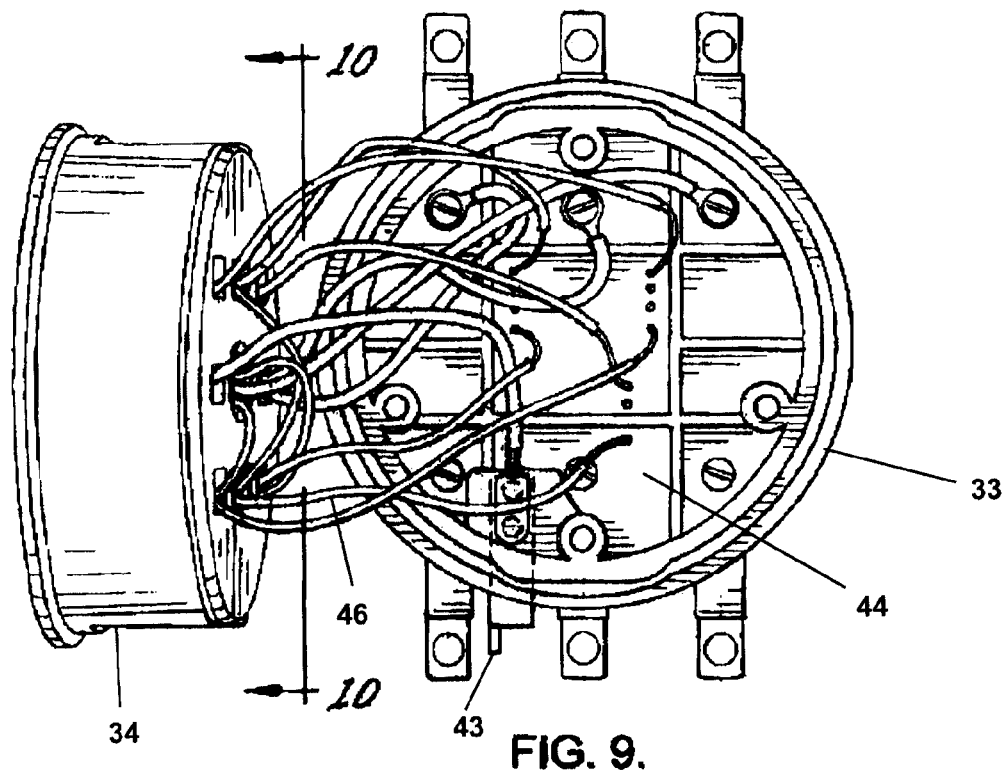
FIG. 9 is an exploded view of the removable jaw contact housing structure that fits onto a cavity defined within the current transformer housing.
Figure 10:
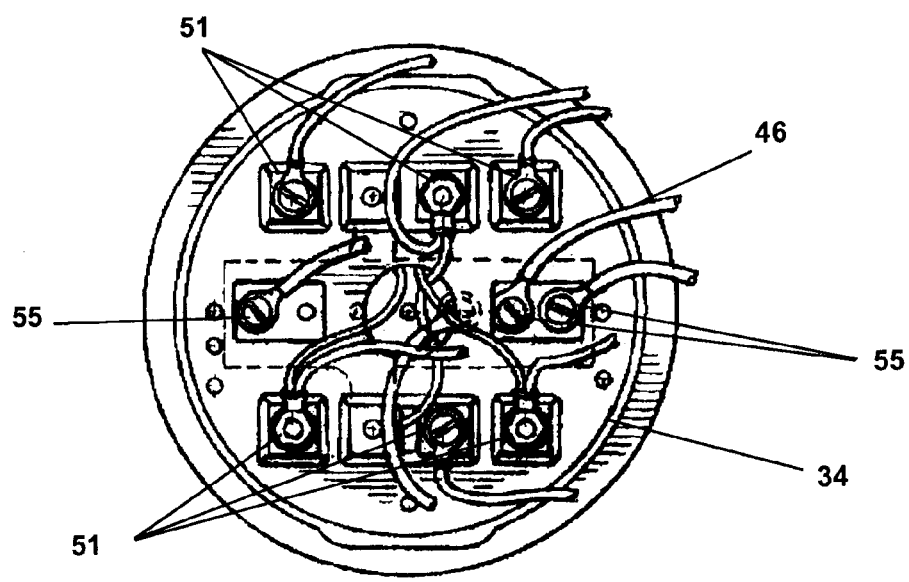
FIG. 10 is a bottom view of the jaw contact housing structure according to this invention.

FIG. 7 shows a prior art watt-hour meter 26 that can be used in conjunction with the adapter 25. The watt-hour meter includes current connectors, referred to at times as current stabs 53 and voltage connectors or voltage stabs 54. These stabs 53, 54 are suited to fit within corresponding current jaw contacts 35 and voltage jaw contacts 36 of the adapter 25.

When placed in electrical connection with the adapter 25, the watt-hour meter receives transformed current from the current transformers 41 noted above. Each current jaw contact 35 on the adapter 25 is connected to a corresponding transformer 41 by current leads 46 that extend through the separate and removable current transformer housing 33 up to the jaw contact housing 34. In preferred embodiments, the current transformers 41 direct current less than about 10 Amps to the transformed current leads 46. In most preferred embodiments, the transformed current is from about 0.1 amps to 7.5 amps. All of the housings, including the jaw contact housing 35, the current transformer housing 33, and the individual current transformer compartments 40 are made of insulating dielectrics for safety from the current on the bus bars 30.

The adapter 25 also includes voltage jaw contacts 36 within the jaw contact housing 34. The voltage jaw contacts 36 have designated leads 45 connected directly to the bus bars 30 and supply a voltage source to the watt-hour meter 26. The voltage leads 45 pass through the appropriate dielectric housings to reach the underlying bus bar 30.

The invention is particularly useful in its safety features. As shown in the figures, the adapter 25 includes separate housings for the current transformers 41 and the jaw contacts 35, 36. These housings 35, 35 are detachable from one another to assist in safely accessing different regions of the adapter without removing the entire adapter from the circuit. As an added feature, the adapter 25 removes the bus bars 30 a distance away from the jaw contact housing 34 to ensure that the watt-hour meter 26 and personnel adjusting the meter are a safe distance from high currents. As an added feature, the adapter 25 of this invention may define a cavity within the current transformer housing 33 separated from the current transformers 41 by a dielectric plate 44 that is part of the current transformer housing 33. This cavity extending from the dielectric plate 44 to the jaw contact housing 34 houses the various leads 45, 46 and provides additional safety to the adapter because the high currents on the bus bars 30 is further removed from the upper face 38 of the jaw contact housing 34.

Overall, the jaw contact housing 34, the current transformer housing 33, and the individual current transformer compartments 41, collectively referred to as the base, are made of safe dielectric materials to insulate the high currents from the utility company and transformed currents from the transformers 41 from human contact. For example only and without limiting the invention, the adapter base, which includes all of the housings is made of fiberglass reinforced polycarbonate in a shape that securely covers the dangerous areas of high current in a K-Base meter socket 20. In a different embodiment, the individual compartments 40 for the current transformers 41 may be made of UV stabilized polycarbonate.

Figure 6A:
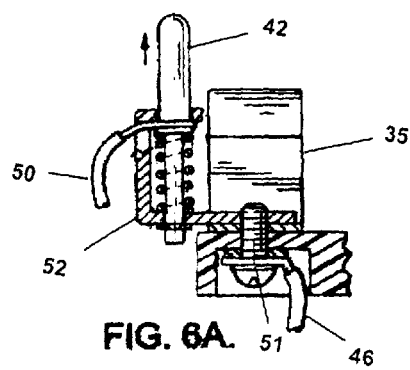
FIG. 6A is a side view of the shorting plunger mechanism according to this invention and shows the plunger in its open position when a watt-hour meter is not installed on the adapter.
Figure 6B:
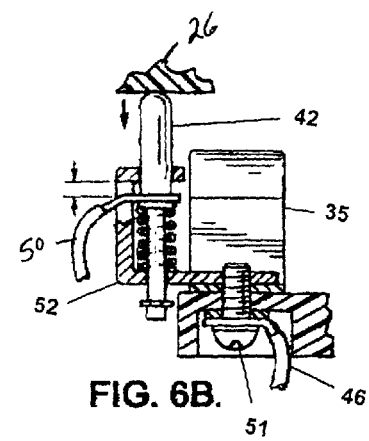
FIG. 6B is a side view of the shorting plunger mechanism according to this invention and shows the plunger in its closed position making a circuit from current transformer leads to an attached watt hour meter.

When a watt-hour meter 26 is plugged into the jaw contacts 35, 36 on the adapter 25, a completed circuit from the transformers 41 to the watt-hour meter 26 allows a proportional current on current leads 46 to measure power consumption at the site. When the watt-hour meter 26 is removed, the safety by-pass switches create a short circuit away from the face 38 of the adapter. In a preferred embodiment, when the watt-hour meter 26 is removed, plunger switches 42 short circuit the transformed current from the transformed current leads back to the secondary on the transformer 41. FIG. 6A shows the plunger mechanism of this embodiment when the watt-hour meter is removed. In this case, transformed current on the transformed current leads 46 is directed to a conductive structure for holding the plunger mechanism and ultimately to the shorting lead 50 directing current back to the secondary on the transformer 41. FIG. 6B shows a watt-hour meter 26 in place, pushing the plunger mechanism 42 downward and forming an open circuit between shorting lead 50 and conductive structure 52 so that transformed current from the current transformers 41 is directed to current jaw contacts 35 on the face 38 of the adapter 25. Current stabs 53 on the watt-hour meter 26 pick up the transformed current for metering.

Those having skill in the art will recognize that the invention may be embodied in many different types of device structures. Accordingly, the invention is not limited to the particular structures illustrated herein.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A meter socket adapter for connecting and disconnecting a watt-hour meter to a meter socket within an electrical circuit while maintaining uninterrupted current flow on the circuit, the adapter comprising:

three continuous bus bars each having a line end and a load end connected to the meter socket, each bus bar comprising a respective insulated bus bar portion;

a respective current transformer electromagnetically connected to each bus bar, wherein each transformer is in direct contact with an insulated bus bar portion, and wherein each current transformer operates in the absence of additional local current transformer installations on the circuit;

current leads extending from each of said current transformers;

three pairs of current jaw contacts, each pair of current jaw contacts being connected to a respective current transformer by respective pairs of said current leads for providing a closed circuit between the current transformers and a watt-hour meter when a watt-hour meter is connected to the jaw contacts;

a current transformer housing for holding said current transformers around said bus bars; and a jaw contact housing adapted to receive the watt-hour meter, said jaw contact housing removably attached to said current transformer housing.

2. An adapter according to claim 1, wherein said bus bars carry more than about 320 amps.

3. An adapter according to claim 1, wherein said bus bars carry more than about 400 amps.

4. An adapter according to claim 1, wherein said bus bars carry up to 600 amps.

5. An adapter according to claim 1, wherein said bus bars are electrically connected to a K-series meter socket.

6. An adapter according to claim 1, wherein said current jaw contacts are adapted to removably receive watt-hour meter connectors for measuring the power consumption on the circuit.

7. An adapter according to claim 1, further comprising a plurality of voltage jaw contacts for connecting the adapter to a voltage source.

8. An adapter according to claim 1, wherein a watt-hour meter is intermittently attached and detached to said jaw contacts while said bus bars are continuously connected to the circuit line and load installation.

9. An adapter according to claim 1, wherein said transformed current leads carry less than about 10 amps.

10. An adapter according to claim 1, wherein said transformed current leads carry between about 0.1 and about 7.5 amps.

11. An adapter according to claim 1, wherein said transformed current leads carry a maximum of about 7.5 amps.

12. An adapter according to claim 1, wherein said transformed current leads carry about 7.5 amps.

13. An adapter according to claim 1, further comprising a respective plunger mechanism for each pair of jaw contacts for shorting transformed current flow back to the current transformer when the watt-hour meter is removed from the jaw contacts.

14. An adapter according to claim 1, further comprising a respective plunger mechanism for each pair of current jaw contacts for shorting transformed current flow when the watt-hour meter is removed from the current jaw contacts, and wherein said plunger mechanisms are attached to said jaw contact housing.

15. An adapter according to claim 1, wherein said current transformer housing and said jaw contact housing are formed from a dielectric polymer material.

16. An adapter according to claim 1, further comprising voltage jaw contacts connected to said jaw contact housing, wherein each voltage jaw contact is connected to a bus bar.

17. A meter socket adapter for connecting and disconnecting a watt-hour meter to a circuit without interrupting the current on the circuit, the adapter comprising:

a current transformer housing comprising insulating transformer compartments;

three continuous bus bars each having a line end and a load end for electrically connecting to a K-series meter socket within the circuit, wherein a portion of each of said bus bars extends through one of said insulating transformer compartments;

a current transformer within each respective insulating transformer compartment in said current transformer housing, wherein each current transformer is electromagnetically connected to a respective bus bar;

three pairs of current jaw contacts, each pair of current jaw contacts being electrically connected to a respective current transformer by respective current leads extending through said current transformer housing; and a jaw contact housing for housing said current jaw contacts, and wherein said jaw contact housing is removably attached to said current transformer housing.

18. An adapter according to claim 17, wherein said bus bars carry more than about 320 amps.

19. An adapter according to claim 17, wherein said bus bars carry more than about 400 amps.

20. An adapter according to claim 17, wherein said bus bars carry up to 600 amps.

21. An adapter according to claim 17, wherein said bus bars are electrically connected to a K-series meter socket.

22. An adapter according to claim 17, wherein the current jaw contacts are adapted to removably receive watt-hour meter connectors for measuring the power consumption on the circuit.

23. An adapter according to claim 17, further comprising a plurality of voltage jaw contacts for connecting the adapter to a voltage source.

24. An adapter according to claim 23, wherein a watt-hour meter is intermittently attached and detached to said jaw contacts while said bus bars are continuously connected to the circuit line and load installation.

25. An adapter according to claim 17, wherein said transformed current leads carry less than about 10 amps.

26. An adapter according to claim 17, wherein said transformed current leads carry between about 0.1 and about 7.5 amps.

27. An adapter according to claim 26, wherein said transformed current leads carry a maximum of about 7.5 amps.

28. An adapter according to claim 17, wherein said transformed current leads carry about 7.5 amps.

29. An adapter according to claim 17, further comprising a respective plunger mechanism for each pair of jaw contacts for shorting transformed current flow back to the current transformer when the watt-hour meter is removed from the jaw contacts, wherein said plunger mechanisms are attached to said jaw contact housing.

30. An adapter according to claim 17, wherein said current transformer housing and said jaw contact housing are formed from a dielectric polymer material.

31. A adapter according to claim 17, wherein said voltage jaw contacts are connected to said jaw contact housing.

32. A meter socket adapter for connecting and disconnecting a watt-hour meter to a circuit without interrupting the current on the circuit, the adapter comprising:

three continuous bus bars each having a line end and a load end for connecting to a K-series meter socket, and wherein said bus bars carry current greater than about 320 amps;

an insulating layer on at least a portion of said bus bars;

a current transformer housing attached to said bus bars;

current transformers electromagnetically connected to each bus bar and housed within said current transformer housing, each current transformer having respective transformed current leads;

a jaw contact housing removably attached to said current transformer housing; and three pairs of current jaw contacts attached to said jaw contact housing, each pair of current jaw contacts being electrically connected to a respective current transformer by respective current leads for providing a closed circuit when a watt hour meter is connected to the jaw contacts.

33. An adapter according to claim 32, wherein each current transformer operates in the absence of local external current transformation.

34. An adapter according to claim 22, wherein each current transformer is in direct contact with said insulating layer on a respective bus bar.

35. An adapter according to claim 32, wherein said bus bars carry more than about 400 amps.

36. An adapter according to claim 32, wherein said bus bars carry up to 600 amps.

37. An adapter according to claim 32, wherein said bus bars are electrically connected to a K-series meter socket.

38. An adapter according to claim 32, wherein the current jaw contacts are adapted to removably receive watt-hour meter connectors for measuring the power consumption on the circuit.

39. An adapter according to claim 38, further comprising a plurality of voltage jaw contacts for connecting the adapter to a voltage source.

40. An adapter according to claim 38, wherein a watt-hour meter is intermittently attached and detached to said jaw contacts while said bus bars are continuously connected to the circuit line and load installation.

41. An adapter according to claim 32, wherein said transformed current leads carry less than about 10 amps.

42. An adapter according to claim 32, wherein said transformed current leads carry between about 0.1 and about 10 amps.

43. An adapter according to claim 32, wherein said transformed current leads carry a maximum of about 7.5 amps.

44. An adapter according to claim 32, wherein said transformed current leads carry about 7.5 amps.

45. An adapter according to claim 32, further comprising a respective plunger mechanism for each pair of jaw contacts for shorting transformed current flow back to the current transformer when the watt-hour meter is removed from the jaw contacts.

46. An adapter according to claim 32, wherein said current transformer housing and said jaw contact housing are formed from a dielectric polymer material.

47. An adapter according to claim 46 wherein said voltage jaw contacts are connected to said jaw contact housing.

48. An adapter according to claim 32 wherein said current transformer housing comprises a compartment for each respective current transformer.

49. An adapter according to claim 32 wherein said current transformer housing defines a cavity for storing a plurality of transformed current leads, said cavity being located between said current transformers and said jaw contact housing.

50. An adapter according to claim 32 wherein said transformed current leads connect said current transformers to said jaw contacts.

* * * * *